(12) United States Patent
Pellerano et al.

(10) Patent No.: US 7,907,018 B2
(45) Date of Patent: Mar. 15, 2011

(54) PHASE NOISE MINIMIZED PHASE/FREQUENCY-LOCKED VOLTAGE-CONTROLLED OSCILLATOR CIRCUIT

(75) Inventors: Stefano Pellerano, Beaverton, OR (US); Ashoke Ravi, Hillsboro, OR (US); Yorgos Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/579,149

(22) Filed: Oct. 14, 2009

(65) Prior Publication Data
US 2010/0033257 A1    Feb. 11, 2010

(51) Int. Cl.
*H03L 7/099* (2006.01)
(52) U.S. Cl. .................. 331/16; 331/1 A; 331/117 FE; 331/57; 331/185
(58) Field of Classification Search .............. 331/17, 331/16, 15, 34, 1 A, 57, 117 FE, 117 R, 175, 331/182, 185; 327/156
See application file for complete search history.

(56) References Cited

U.S. PATENT DOCUMENTS

| | | | |
|---|---|---|---|
| 6,064,277 A * | 5/2000 | Gilbert | 331/117 R |
| 6,531,926 B1 | 3/2003 | Pate et al. | |
| 6,680,657 B2 | 1/2004 | Wang et al. | |
| 7,046,098 B2 | 5/2006 | Staszewski | |
| 7,254,507 B2 | 8/2007 | Dosho et al. | |
| 7,391,271 B2 | 6/2008 | Cranford, Jr. et al. | |
| 2006/0097796 A1 | 5/2006 | Gomez | |
| 2008/0284530 A1 | 11/2008 | Pellerano et al. | |

OTHER PUBLICATIONS

Hegazi, et al., "A Filtering Technique to Lower LC Oscillator Phase Noise", IEEE Journal Of Solid-State Circuits, vol. 36, Issue No. 12, Dec. 2001, pp. 1921-1930.
Hegazi, et al., "A 17 mW transmitter and frequency synthesizer for 900-MHz GSM fully integrated in 0.35-µm CMOS", Symnposium on VLSI Circuits Digest of Technical Papers, Jun. 13-15, 2002 ,pp. 234-237.
Hajimiri, et al., "A General Theory of Phase Noise in Electrical Oscillators", IEEE Journal Of Solid-State Circuits, vol. 33, Issue No. 2, Feb. 1998, pp. 179-194.
Maxim, A. "A multi-Rate 9.953-12.5 GHz 0.2 um SiGe BiCMOS LC Oscillator Using a Resistor-Tuned Varactor and a Supply Pushing Cancellation Circuit", IEEE Journal of Solid-State Circuits, vol. 41, Issue 4, Apr. 2006, pp. 918-934. Hajimiri, et al., "Jitter and Phase Noise in Ring Oscillators", IEEE Journal Of Solid-State Circuits, vol. 34, Issue No. 6, Jun. 1999, pp. 790-804.
Non-Final Office Action Received for U.S. Appl. No. 11/747,927 mailed on Oct. 29, 2008, 15 pages.
Final Office Action Received for U.S. Appl. No. 11/747,927 mailed on Apr. 17, 2009, 12 pages.

* cited by examiner

*Primary Examiner* — Robert Pascal
*Assistant Examiner* — Ryan Johnson
(74) *Attorney, Agent, or Firm* — Carrie A. Boone, P.C.

(57) ABSTRACT

A phase noise minimization circuit is disclosed, to be used in a voltage-controlled oscillator (VCO) circuit embedded in a feedback system. The phase noise minimization circuit includes a noise power meter to analyze the control voltage fed into the VCO by the feedback system and determine its voltage noise power. Since the VCO is controlled by the feedback system, the control voltage noise power is also an indication of the VCO phase noise power for frequencies offset within the bandwidth of the feedback system. The VCO has several parameters that can be adjusted to affect its phase noise. A minimization algorithm generates the optimum set of parameters that minimize the control voltage noise power (and thus the VCO phase noise power), and sends them to the oscillator. The phase noise minimization circuit may be used in a variety of applications, particularly in phase-locked loop and frequency-locked loop VCOs.

18 Claims, 11 Drawing Sheets

PHASE NOISE MINIMIZED PHASE/FREQUENCY-LOCKED VOLTAGE-CONTROLLED OSCILLATOR CIRCUIT

TECHNICAL FIELD

This application relates to frequency-stabilized oscillators and, more particularly, to minimizing raw noise in a voltage-controlled oscillator.

BACKGROUND

Voltage-controlled oscillators (VCOs) and other phase/frequency tunable oscillator are typically embedded into a feedback system, such as Phase/Frequency-Locked Loops (PLLs/FLLs), to generate a sinusoidal carrier at a desired frequency with a very high spectral purity (i.e., low phase noise). As an example, the sinusoidal carrier may be used as the local oscillator (LO) in transceiver architectures. In the specific case of a PLL, a very clean clock reference (normally generated from a crystal oscillator) is used to "lock" in phase the VCO to run at a frequency which may be an integer or fractional multiple of the crystal oscillator frequency (see FIG. 1). The VCO itself is typically much noisier relative to a crystal oscillator.

There are several parameters that may affect the performance of a free-running VCO in terms of phase noise. In particular, non-idealities (e.g., mismatches) may increase the noise up-conversion around the carrier. Several techniques have been proposed to improve the VCO noise performance. However, these techniques are often not practical, since they are effective only for a narrow range of oscillation frequencies or process/voltage/temperature (PVT) variations.

Figure 1:
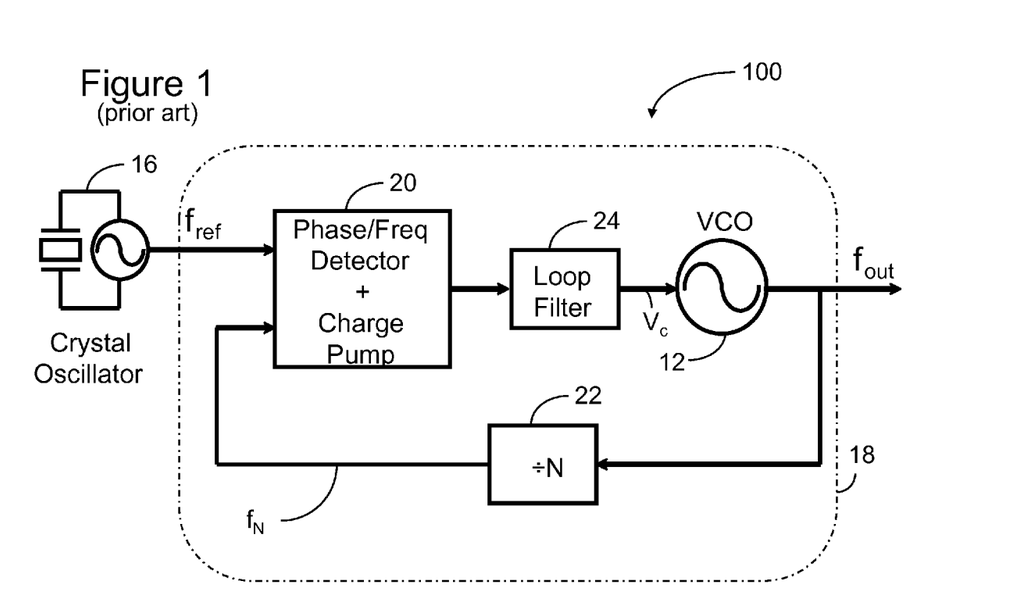
FIG. 1 is a schematic illustration of a PLL having a clock reference frequency ($f_{ref}$) generated by a crystal oscillator, according to the prior art.

A feedback system 100, such as a PLL or an FLL, is depicted in FIG. 1, according to the prior art. The feedback system 100 includes a VCO 12 and a feedback loop 18, including a crystal oscillator 16, a phase/frequency detector and charge pump 20, a loop filter 24, and a frequency divider 22. Typically, the feed back loop 18 of a PLL-VCO uses the frequency divider 22 to provide a divided-down (by N) signal version $f_N$ of the output signal $f_{out}$ from the VCO 12. The circuit 100 compares the signal $f_N$ to the reference signal $f_{ref}$ waveform from the local oscillator 16 (a crystal oscillator in the example). The circuit 100 then generates a control voltage $V_c$ that tracks and corrects the frequency fluctuation of the VCO 12 due to noise. This noise reduction/cancellation occurs only for frequency offsets within the bandwidth of the output of the loop filter 24. Additionally, in the illustrated prior art circuit, the VCO noise is canceled after being generated by injecting equal but opposite frequency fluctuations.

Therefore, it would be useful to have a robust technique to minimize the VCO phase noise over wide oscillation frequency range and PVT variations.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a phase noise minimization circuit is disclosed, to be used with phase/frequency-locked voltage-controlled oscillator circuits. The phase noise minimization circuit includes a noise power circuit to analyze a control voltage fed into the phase/frequency locked voltage-controlled oscillator and determine its phase noise power. A minimization algorithm generates a correction parameter, based on the phase noise power, and sends the correction parameter to the oscillator to minimize its phase noise. The phase noise minimization circuit may be used in a variety of applications, particularly in phase-locked loop and frequency-locked loop VCOs.

As stated before, when a VCO is embedded in a feedback loop (such as a PLL), the feedback action generates a control signal that counteracts the VCO frequency fluctuations due to noise. Therefore, within the loop bandwidth, the control signal has all the information about the noise of the free-running VCO. The phase noise minimization circuit utilizes the noise information to minimize the VCO raw noise by optimizing those parameters that control the up-conversion of flicker/white noise around the carrier. By observing and minimizing the voltage noise present on the control signal, any "knob" that affects the VCO raw phase noise may be tuned to the optimum value. This optimization may be done over any oscillation frequency range and PVT variation.

Further, the phase noise minimization circuit improves phase noise in any phase/frequency locked oscillator thus making them more compliant with high spectral purity standards, and thus usable in multi-radio architectures. Lower phase noise may also be traded with power consumption: the same phase noise may be achieved with less power, thus saving battery life and making products more competitive. Power consumption in local oscillator generation circuits affects transceiver power consumption, since such circuits operate both in transmission and reception.

In the following detailed description, reference is made to the accompanying drawings, which show by way of illustration specific embodiments in which the claimed invention may be practiced. However, it is to be understood that other embodiments will become apparent to those of ordinary skill in the art upon reading this disclosure. The following detailed description is, therefore, not to be construed in a limiting sense, as the disclosed scope is defined by the claims.

Figure 2:
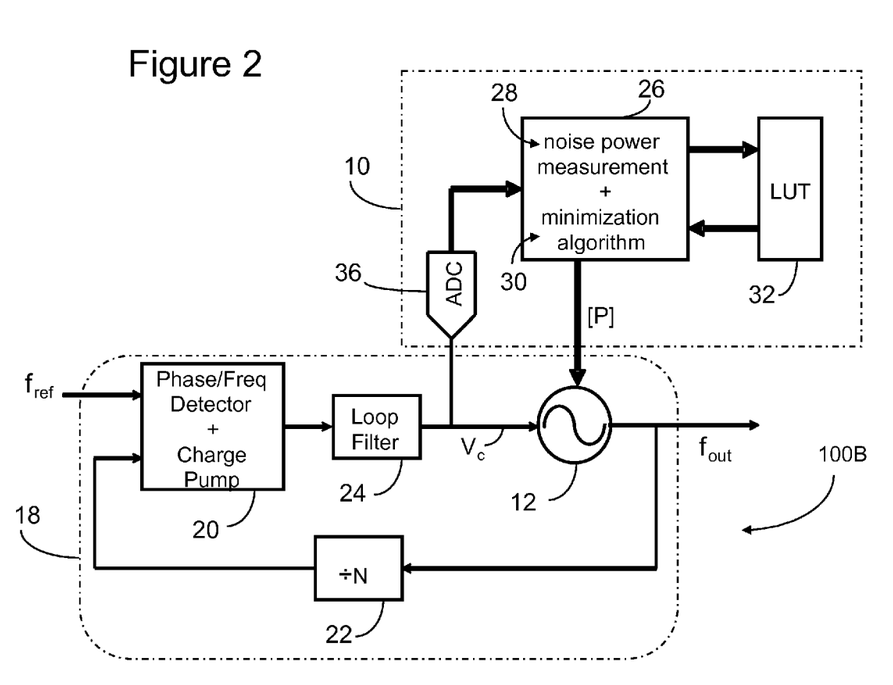
FIG. 2 is a schematic illustration of a phase noise minimization circuit in an analog PLL, according to some embodiments.

FIG. 2 illustrates a phase noise minimization circuit 10 practiced in a PLL feedback system 100B, according to some embodiments. Although the embodiments illustrated herein are exemplified using voltage-controlled oscillator (VCO) 12 as a specific example, the phase noise minimization circuit 10 may be applied more broadly to other kinds of controlled oscillator circuits. Several varieties of feedback systems, denoted 100B, 100C, and so on, which use the phase noise minimization circuit 10, are described herein, any one of which may be referred to generally as feedback system 100.

The phase noise minimization circuit 10 includes a calibration module or circuit 26 that includes a noise power meter 28 and a noise minimization algorithm 30. The noise power meter 28 of the calibration circuit 26 determines the noise power of the VCO (analog) control signal $V_c$ by analyzing the voltage noise present on the control signal $V_c$ input to the VCO 12. Within the output bandwidth of the loop filter 24, the voltage fluctuations on the control voltage $V_c$ will be those generated by the feedback mechanism 18 to track and cancel the VCO frequency fluctuations. The measurement performed by the meter 28 of the control signal noise voltage (up to the loop filter bandwidth) is therefore a good measure of the VCO phase noise power.

In the embodiment illustrated, in the calibration phase, the noise minimization algorithm 30 functioned as follows: after the PLL has settled, the noise power on the control voltage $V_c$ is measured up to the output bandwidth of the loop filter 24. A set of correction parameters [P] is determined to minimize the noise power, and is applied to the VCO 12 to minimize its phase noise. The correction parameters may be obtained in a variety of ways known to and selectable by one of ordinary skill in the art.

Thus, the noise power meter 28 receives the control voltage Vc from feedback circuit 100B, analyzes the voltage noise present on the control voltage Vc, to determine the phase noise power of the oscillator 12. The minimization algorithm 30 then takes the phase noise power information obtained by the noise power meter 28 and finds the optimum set of values for the parameter [P] that minimizes the VCO phase noise power, and subsequently sends the optimum parameter set [P] to the oscillator 12.

The overall time for the calibration to take place is not a critical issue since the calibration may be done once, when a system including the VCO is powered-up. The optimum values of [P] calculated for different oscillation frequencies and PVT variations may be stored in a look-up table (LUT) 32 to be quickly accessed by the algorithm 30 during normal operation. Practice of the phase noise minimization circuit 10, as illustrated in FIG. 2, includes a sufficiently low-noise analog-to-digital converter (ADC) 36, in some embodiments, so as to not disturb the noise power measurement 28 of the voltage of the VCO control signal $V_c$. The ADC 36 converts the analog signal $V_c$ to a digital signal for analysis by the calibration circuit 26.

The phase noise minimization circuit 10 minimizes the intrinsic noise of the oscillator 12 before the noise is generated, in contrast to the prior PLL of FIG. 1, where the VCO noise is canceled after having been generated, by injecting equal but opposite frequency fluctuations in the feedback loop 18. The circuit 10 is therefore effective in feedback systems 100B, such as PLLs or FLLs, within and beyond the loop bandwidth of the feedback system 18.

Figure 3:
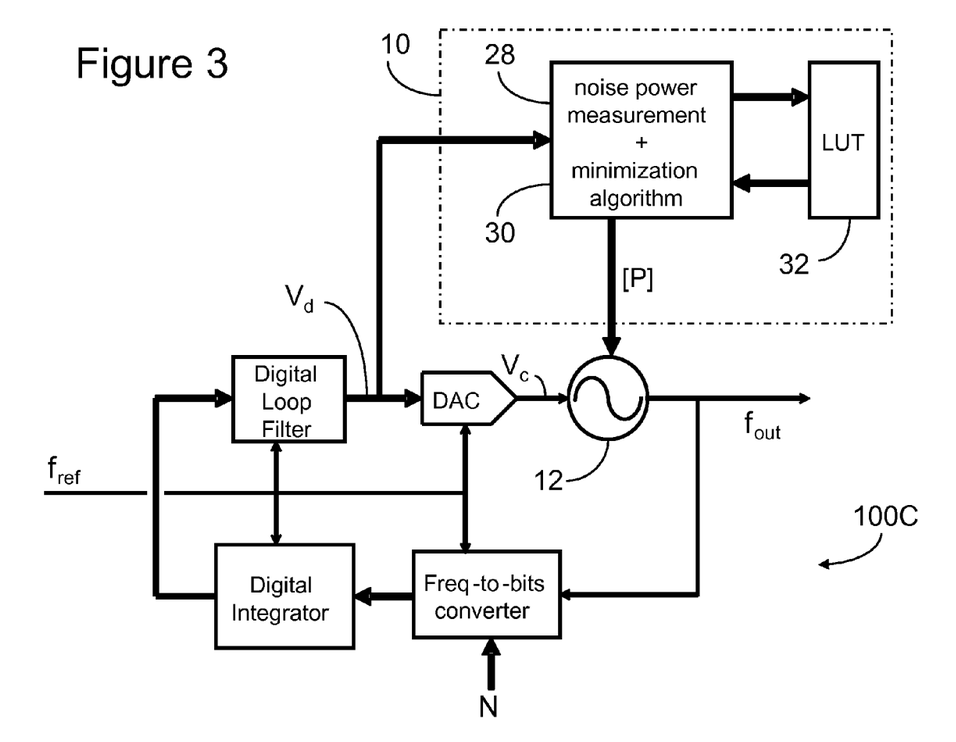
FIG. 3 is a schematic illustration of the phase noise minimization circuit in a digital PLL, according to some embodiments.

FIG. 3 is a schematic illustration of the phase noise minimization circuit 10 operable upon a digital PLL 100C, according to some embodiments. In the digital PLL 100C, the control signal voltage $V_c$ is already converted to a digital signal $V_d$ in the digital domain of the PLL. Therefore, the VCO noise measurement and minimization may be directly performed by the phase noise minimization circuit 10 without the need for an extra ADC 36 to convert the analog voltage control signal $V_c$ to digital.

The phase noise minimization circuit 10 may be used in various VCO applications, as described below. The examples are shown for analog PLLs, but the present minimized phase noise circuit technique may be applied to digital PLLs as well, as in the digital PLL 100C of FIG. 3.

EXAMPLE I

Noise Filter Tuning

Figure 4A:
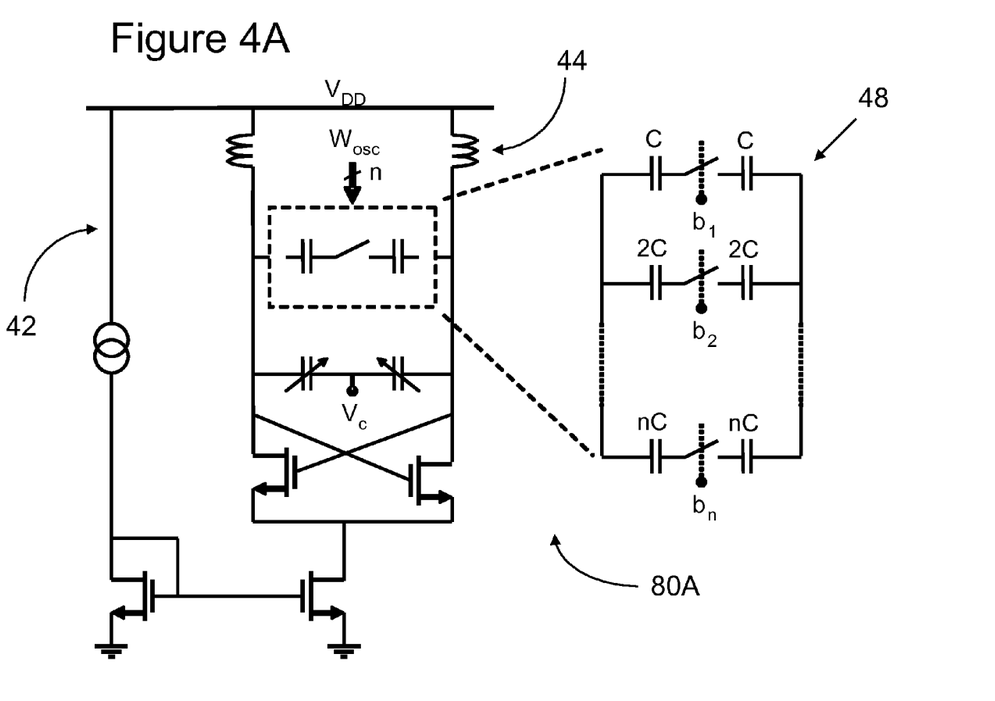
FIGS. 4A and 4B are schematic illustrations of LC-VCOs with band-switching and band-switching plus switched-capacitor noise filters, respectively, according to some embodiments.
Figure 4B:
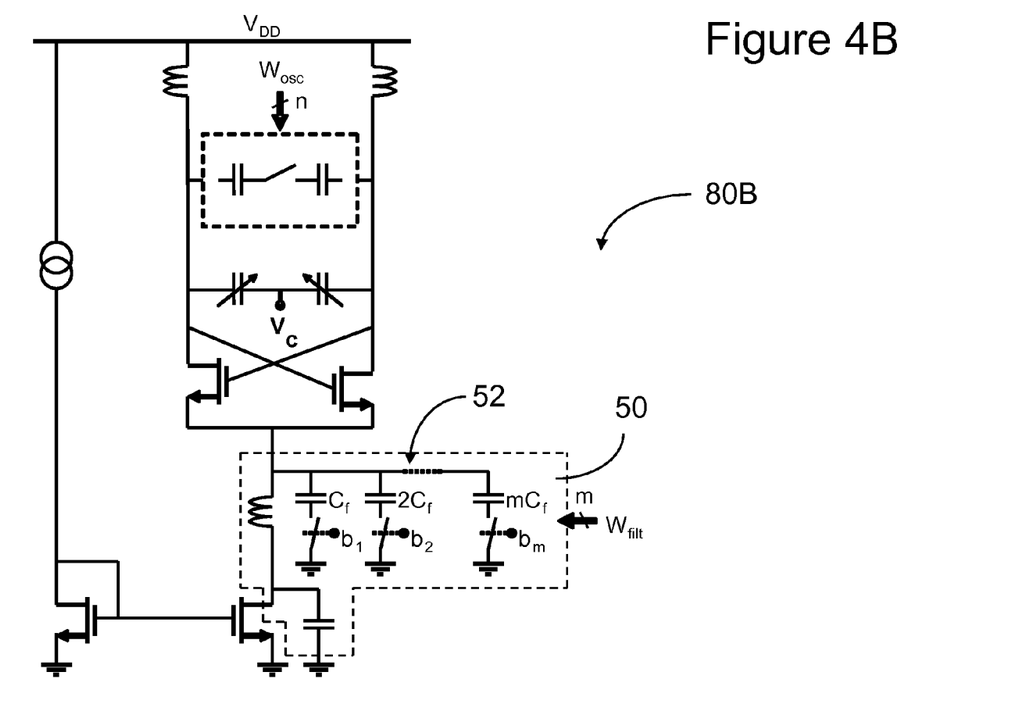

FIGS. 4A and 4B depict one utilization of the phase noise minimization circuit 10, according to some embodiments. FIG. 4A is an LC-VCO 80A with a switched capacitor circuit 48 used within the LC tank 44. FIG. 4B is an LC VCO 80B with a noise filter 50. The switched capacitor circuits 48 are typically used in the tank circuit 44 to achieve a wide tuning range without increasing too much the oscillator frequency/voltage gain. Beside the typical analog control voltage $V_c$, a digital control word $W_{osc}$ is fed into the VCO to coarsely select the oscillation frequency.

In the VCO 80B of FIG. 4B, the resonant noise filter 50 running at twice the oscillation frequency of the VCO is adopted to minimize both $1/f^2$ and $1/f^3$ phase noise. (See Hegazi, E., Sjoland, H., Abidi, A. A., *A filtering technique to lower LC oscillator phase noise*, IEEE Journal of Solid-State Circuits, Vol. 36, Issue 12, December 2001, pp. 1921-1930.) This technique is not very effective for wideband VCOs, where the oscillation frequency may vary more than fifty percent. This problem may be solved by making the filter 50 wideband using a switched capacitor circuit 52 controlled by a digital tuning word $W_{filt}$, as shown. (See Hegazi, E. & Abidi, A. A., *A 17 mW transmitter and frequency synthesizer for 900 MHz GSM fully integrated in 0.35 μm CMOS*, Symposium on VLSI Circuits Digest of Technical Papers, 13-15 June. 2002, pp. 234-237.) However, the problem of how to track the oscillator frequency still remains.

Figure 5:
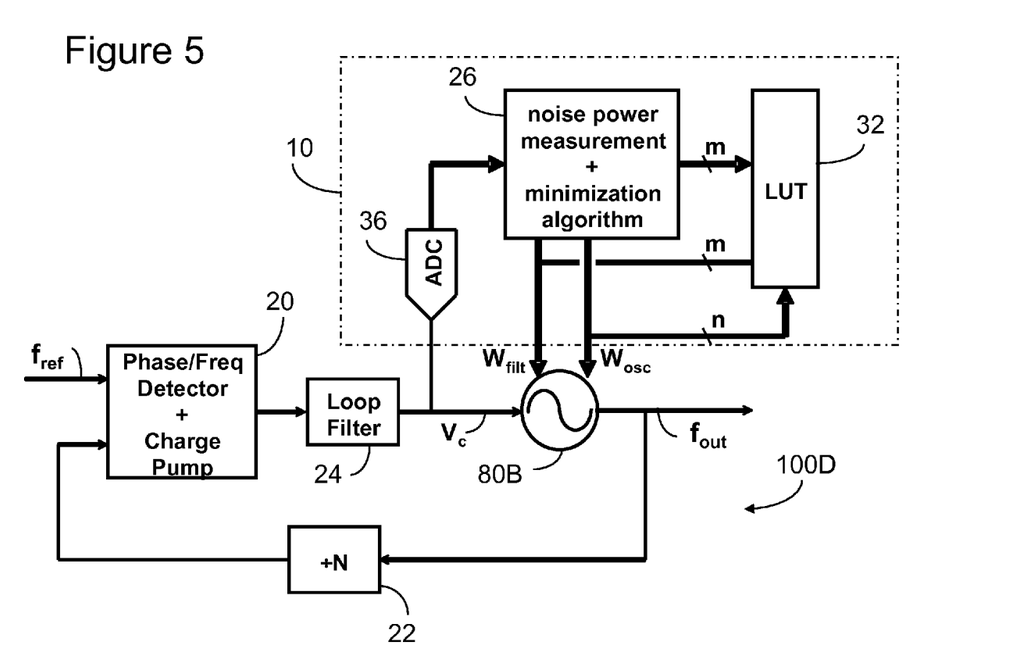
FIG. 5 is a schematic diagram illustrating an example of noise filter tuning using the phase noise minimization circuit, according to some embodiments.

The phase noise minimization circuit 10 may be used to generate the $W_{osc}$ and $W_{filt}$ words used in the VCOs of FIGS. 4A and 4B, in some embodiments, where the parameter [P] is the digital tuning word $W_{filt}$ and the digital control word $W_{osc}$. As shown in FIG. 5, the phase noise minimization circuit 10 is part of a feedback system 100D, in which the circuit 10 uses the calibration circuit 26 to optimally generate the digital tuning word, $W_{filt}$, for each digital control word, $W_{osc}$, to be used by the VCO in FIG. 4B. The result for the circuit 80B is that the noise filter 50 resonates at twice the VCO frequency, thereby giving optimum filtering performance over the whole tuning range, in some embodiments.

For each VCO frequency (or synthesized channel) the optimum setting (digital tuning word $W_{filt}$) for the noise filter 50 is chosen by selecting the one that minimizes the voltage noise present on the VCO control signal ($V_c$). For each frequency setting in the VCO (digital word $W_{osc}$), after the PLL has settled, the noise power on the control voltage $V_c$ is measured up to the loop bandwidth, and then minimized by selecting the proper $W_{filt}$. The measured optimum values of $W_{filt}$ are stored in a look-up table (LUT) addressed by $W_{osc}$ (n elements, m bits wide).

EXAMPLE II

Offset Correction to Minimize Flicker Noise Up-Conversion

Voltage offset (generated by device mismatches) in a differential pair used to compensate the tank losses in LC oscillators is responsible for flicker-noise up-conversion around a carrier. (Hajimiri, A. & Lee, T. H., *A general theory of phase noise in electrical oscillators*, IEEE Journal of Solid-State Circuits, Vol. 33, Issue 2, February 1998, pp. 179-194.) This problem may be solved using the phase noise minimization circuit 10.

Figure 6:
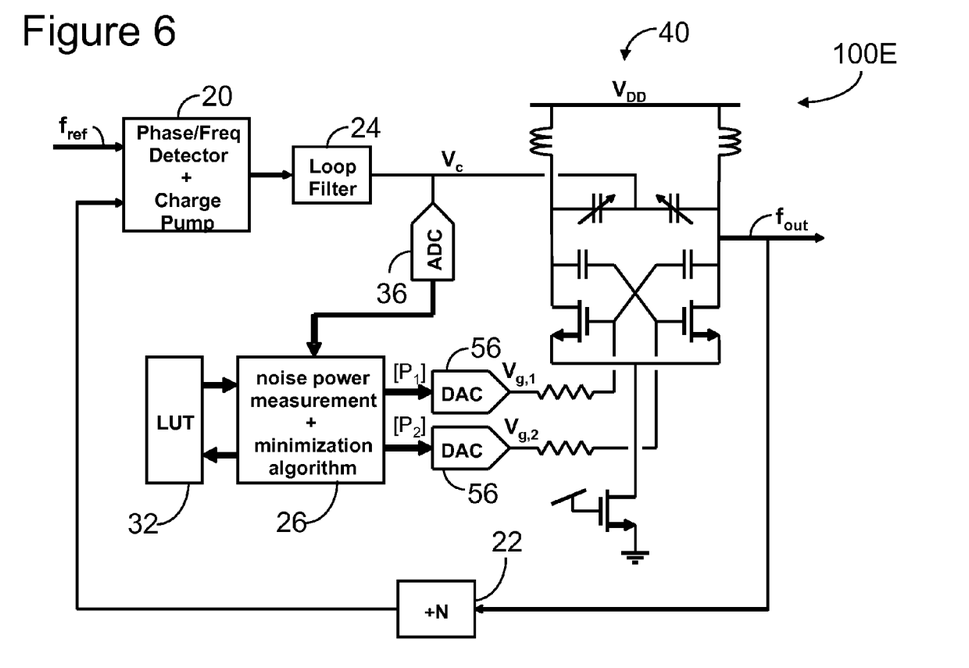
FIG. 6 is a schematic diagram illustrating an example of offset correction to minimize flicker noise up-conversion using the phase noise minimization circuit, according to some embodiments.

In FIG. 6, a feedback system 100E, including the phase noise minimization system 10, is schematically depicted, according to some embodiments. The feedback system 100E includes an AC-coupled transconductor 40 and two digital-to-analog converters (DACs) 56, which generate two different DC biases ($V_{g,1}$ and $V_{g,2}$). Using this additional circuitry, the voltage offset may be removed.

However, the offset is strongly dependent on PVT and may not be predicted accurately enough during the design phase. The phase noise minimization circuit 10 may be used to optimize the biases of the two active devices by directly minimizing the voltage noise generated by the feedback action on the VCO control voltage $V_c$. As in the other examples shown, the voltage $V_c$ is monitored by the calibration circuit 26, in which the meter 28 measures the voltage noise power present on $V_c$ and the minimization algorithm 30 provide optimum parameters [$P_1$] and [$P_2$] to minimize the voltage noise power.

EXAMPLE III

Power Supply Sensitivity Minimization

Sensitivity to the power supply in oscillators manifests as a dependence of the oscillation frequency on the supply voltage level. Any voltage noise on the power supply is therefore up-converted as phase/frequency noise around the carrier. It is possible to minimize the supply sensitivity by using proper voltage-dependent non-linear capacitors that may introduce equal but opposite frequency variation with the power supply. (Maxim, A., *A Multi-Rate 9.953-12.5-GHz 0.2 μm SiGe BiCMOS LC Oscillator Using a Resistor-Tuned Varactor and a Supply Pushing Cancellation Circuit*, IEEE Journal of Solid-State Circuits, Vol. 41, Issue 4, April 2006, pp. 918-934.) However, it is extremely difficult to obtain a substantial cancellation over an extended supply voltage range. Moreover, the optimum supply voltage at which this cancellation occurs is strongly affected by process and temperature variations.

Figure 7:
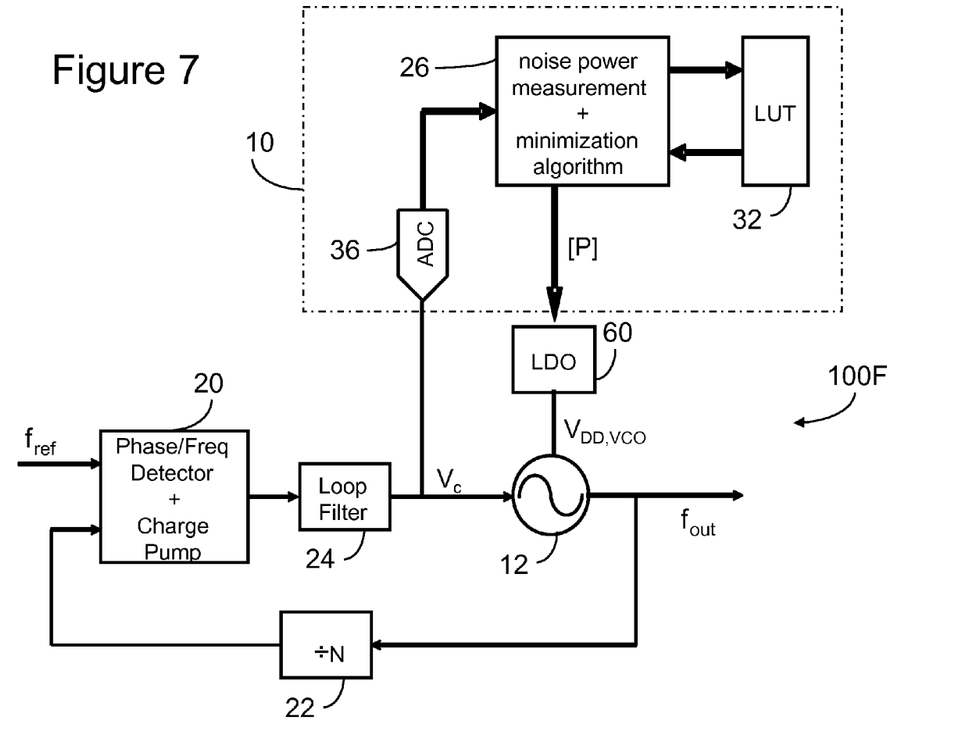
FIG. 7 is a schematic diagram illustrating an example of power supply noise sensitivity minimization in the phase noise minimization circuit using a low dropout voltage circuit that controls the oscillator power supply fluctuations, according to some embodiments.

In FIG. 7, a feedback system 100F includes the phase noise minimization circuit 10 and a low dropout voltage (LDO) circuit 60 that controls the oscillator power supply, according to some embodiments. By changing the parameter [P] fed into the LDO, the phase noise minimization circuit 10 finds the optimum VCO power supply level, based on the minimization of the noise detected at the control voltage $V_c$. The LDO circuit 60 therefore generates an optimum supply voltage level $V_{DD,VCO}$ that minimizes the sensitivity from the power supply.

EXAMPLE IV

Rising and Falling Edge-Rates Equalization

Figure 8A:
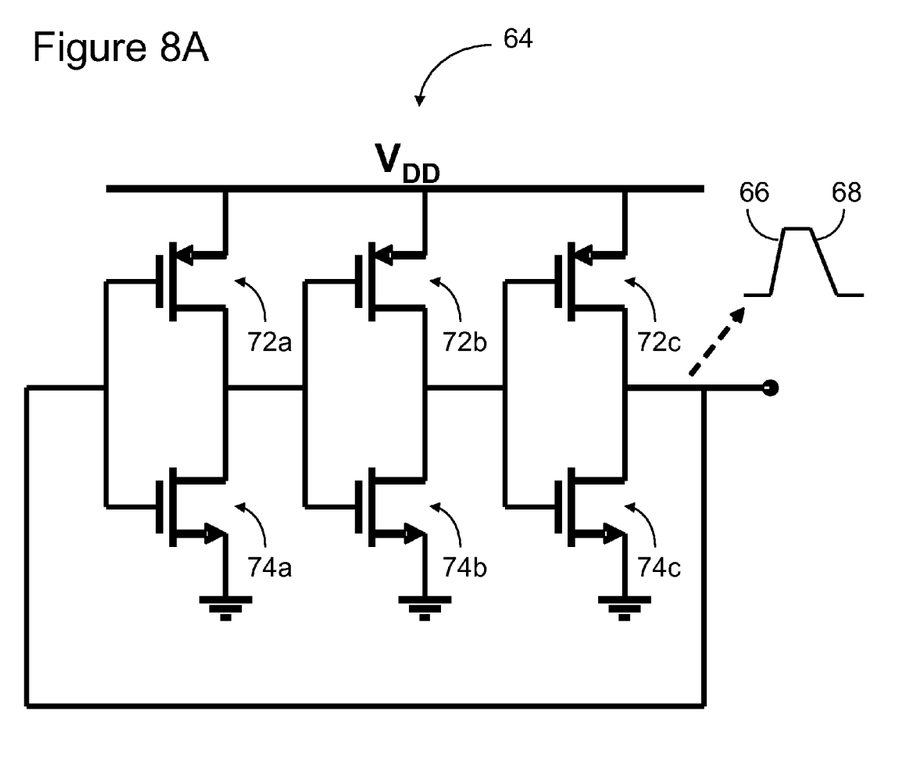
FIGS. 8A and 8B are schematic diagrams illustrating application of the phase noise minimization circuit in combination with a ring oscillator to significantly affect the up-conversion of flicker noise, according to some embodiments.

It has been shown that symmetry in ring oscillator significantly affects the up-conversion of flicker noise. (See Hajimiri, A., Limotyrakis, S. & Lee, T. H., *Jitter and phase noise in ring oscillators*, IEEE Journal of Solid-State Circuits, Vol. 34, Issue 6, June 1999, pp. 790-804.) As an example, consider a single-ended, three-stage ring oscillator 64, as exemplified in FIG. 8A. The oscillator 64 includes three p-type metal oxide semiconductor (pMOS) devices 72a, 72b, and 72c (collectively, PMOS devices 72) and three n-type metal oxide semiconductor (nMOS) devices 74a, 74b, and 74c (collectively NMOS devices 74). The rising-edge slope 66 is determined by the pull-up strength of each PMOS device 72, while the falling-edge slope 68 is determined by the pull-down strength of each NMOS device 74. In order to equalize the rising and falling edges so to minimize the flicker noise up-conversion, the ratio of NMOS 74 to PMOS 72 size is carefully chosen. However, it is almost impossible to maintain an accurate enough symmetry over process, temperature and voltage (PVT) variations.

Figure 8B:
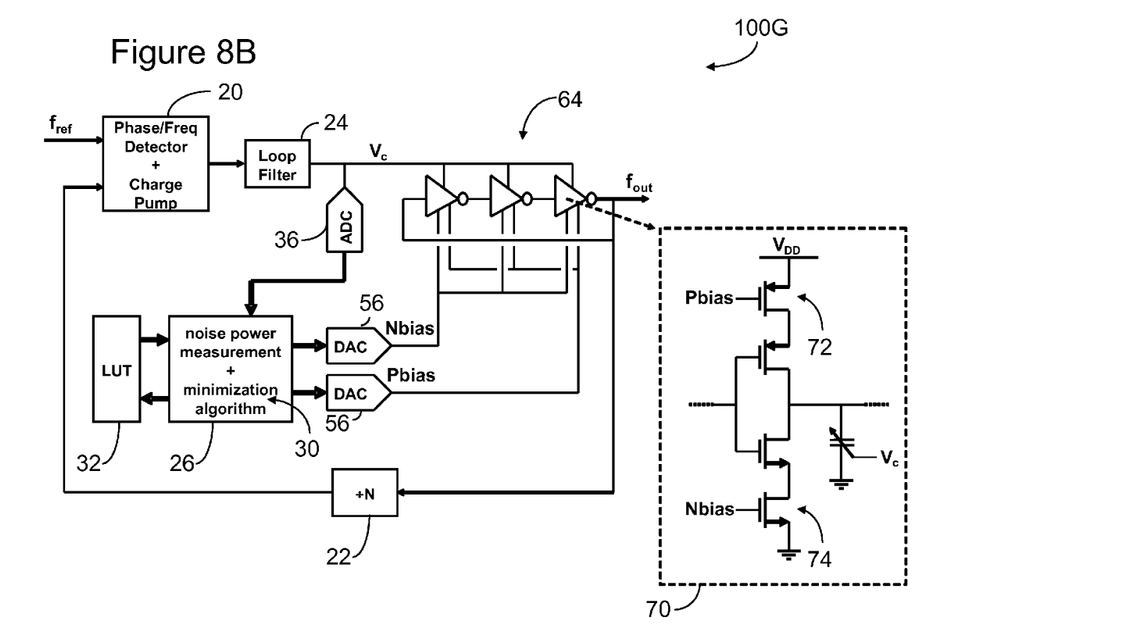

The phase noise minimization circuit 10 may be used to help adjust the rising and falling edge slopes over PVT and maintain a very good symmetry. As an example, a feedback system 100G is depicted in FIG. 8B, including phase noise minimization circuit 10, in some embodiments. The feedback system 100G includes a ring oscillator 64, in which each inverter 70 includes complementary NMOS 74 and PMOS 72 devices. The bias voltages, N-bias and P-bias, are used to adjust the pull-down and the pull-up strength of the inverters in the ring oscillator 64. In this way, the rising and falling edges of the output signal, $f_{out}$, can be equalized, with the result being a mitigation of flicker noise up-conversion. As described above, the phase noise minimization circuit 10 adjusts the P-bias and N-bias voltage levels in the inverters 70 of the ring oscillator until the noise on the control voltage $V_c$ is minimized.

Figure 9:
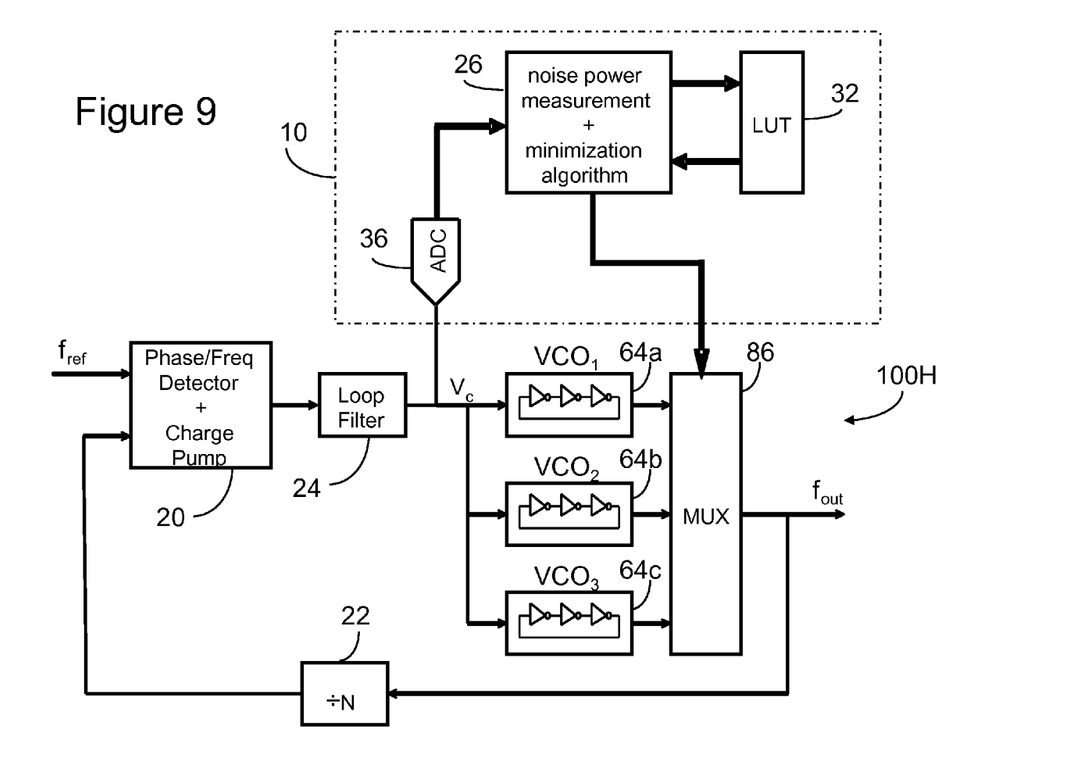
FIG. 9 is a schematic diagram illustrating use of three ring oscillators to accomplish better symmetry between the rising and falling edges using the phase noise minimization circuit, according to some embodiments.

As exemplified in FIG. 9, an alternative is to implement a feedback system 100H including the phase noise minimization circuit 10, and further including different ring oscillators 64a, 64b, and 64c (three in the example illustrated), in some embodiments. Each ring oscillator 64a, 64b, and 64c has different ratios between its NMOS and PMOS circuitry. The feedback system 100H also includes a multiplexer (MUX) 86, to select the ring oscillator 64a, 64b, or 64c that shows better symmetry between the rising and falling edges. The choice is made by the phase noise minimization circuit 10 by selecting the ring oscillator that minimizes the voltage noise on the control voltage $V_c$, as described above. The feedback system 100H may further include additional ring oscillators, such that, no matter how many ring oscillators are present, the MUX 86 selects the optimum ring oscillator based on the symmetry between rising and falling edges of each.

While the application has been described with respect to a limited number of embodiments, those skilled in the art will appreciate numerous modifications and variations therefrom. It is intended that the appended claims cover all such modifications and variations as fall within the true spirit and scope of the invention.

We claim:

1. A phase noise minimization circuit to operate in a feedback system, the circuit comprising:
    a calibration circuit, comprising:
        a noise power meter to receive a control voltage fed into an oscillator, the oscillator, part of the feedback system, to generate an output frequency, wherein the noise power meter analyzes voltage noise present on the control voltage that corresponds to a phase noise power of the oscillator within a bandwidth of the feedback system, the analysis resulting in a control voltage noise power; and a noise minimization algorithm circuit, to:
obtain the control voltage noise power from the noise power meter;
generate a correction parameter that minimizes the control voltage noise power; and
send the correction parameter to the oscillator;
the feedback system further comprising an AC-coupled transconductor and two digital-to-analog converters to generate two different DC biases, the transconductor and digital-to-analog converters to remove a voltage offset generated by device mismatches, wherein the two different DC biases are optimized by the calibration circuit to minimize flicker noise up-conversion by minimizing the control voltage noise power of the oscillator wherein the phase noise generated by the oscillator is minimized by the correction parameter.

2. The phase noise minimization circuit of claim 1, wherein the oscillator is a voltage-controlled oscillator.

3. The phase noise minimization circuit of claim 1, wherein the feedback system is a phase-locked feedback loop system.

4. The phase noise minimization circuit of claim 1, wherein the feedback system is a frequency-locked feedback loop system.

5. The phase noise minimization circuit of claim 1, wherein the voltage noise present on the control voltage is analyzed up to a bandwidth of the feedback system.

6. The phase noise minimization circuit of claim 1, further comprising:
a lookup table to store a plurality of parameters calculated for different oscillation frequencies and process/voltage/temperature variations, the correction parameter being one of the plurality of parameters;
wherein the noise minimization algorithm obtains the correction parameter from the look-up table.

7. The phase noise minimization circuit of claim 1, wherein the control voltage is a digital signal.

8. The phase noise minimization circuit of claim 1, further comprising:
an analog-to-digital converter to convert the control voltage to a digital signal, wherein the digital signal is analyzed by the calibration circuitry.

9. A feedback system, comprising:
a feedback system comprising a voltage-controlled oscillator, the voltage-controlled oscillator to generate an output signal, the voltage-controlled oscillator to receive a control signal derived from a reference signal, wherein the control signal has a voltage noise power; and
a phase noise minimization circuit, comprising:
a noise power meter to analyze voltage noise present on the control signal to determine the phase noise power of the voltage-controlled oscillator; and
a noise minimization algorithm circuit, to:
obtain the voltage noise power from the noise power meter;
generate a correction parameter based on the phase noise power; and
send the correction parameter to the oscillator;
the feedback system further comprising an AC-coupled transconductor and two digital-to-analog converters to generate two different DC biases, the transconductor and digital-to-analog converters to remove a voltage offset generated by device mismatches, wherein the two different DC biases are optimized by the calibration circuit to minimize flicker noise up-conversion by minimizing the control voltage noise power of the oscillator;
wherein the phase noise generated by the oscillator is minimized by the correction parameter.

10. The feedback system of claim 9, further comprising:
a lookup table to store a plurality of parameters, calculated for different oscillation frequencies and process/voltage/temperature variations, the correction parameter being one of the plurality of parameters;
wherein the noise minimization algorithm obtains the correction parameter from the look-up table.

11. The feedback system of claim 10, further comprising:
an analog-to-digital converter to convert the control signal to a digital signal, wherein the digital signal is analyzed by the noise power meter.

12. The feedback system of claim 11, wherein the voltage noise on the control voltage is analyzed up to a bandwidth of the feedback system.

13. The feedback system of claim 12, wherein the control signal is a digital signal.

14. A system to reduce up-conversion of flicker noise in a voltage-controlled oscillator, the system comprising:
a noise power meter and noise minimization algorithm circuit;
a first digital-to-analog converter coupled to a first output of the noise power meter and noise minimization algorithm circuit, the first digital-to-analog converter to generate a first direct current bias, $V_{g,1}$;
a second digital-to-analog converter coupled to a second output of the noise power meter and noise minimization algorithm circuit, the second digital-to-analog converter to generate a second direct current bias, $V_{g,1}$; and
an alternating current-coupled transconductor oscillator comprising a pair of n-type metal oxide (NMOS) semiconductor devices, each NMOS semiconductor devices comprising a gate voltage bias, wherein the transconductor oscillator and digital-to-analog converters remove the gate voltage biases.

15. The system of claim 14, further comprising:
a phase/frequency detector;
a charge pump; and
a loop filter.

16. The system of claim 15, further comprising a phase noise minimization circuit, comprising:
the noise power meter and noise minimization algorithm circuit;
a lookup table; and
an analog-to-digital circuit coupled to an output of the loop filter;
wherein the phase noise minimization circuit observes low-frequency voltage noise power on a transconductor oscillator control voltage once the oscillator is locked with a phase-locked loop.

17. The system of claim 15, wherein the noise power meter and noise minimization algorithm circuit generates a first optimum parameter to the first digital-to-analog converter and a second optimum parameter to the second digital-to-analog converter to minimize the voltage noise power.

18. The system of claim 16, wherein the flicker noise, given by one divided by oscillator frequency (1/f) is reduced by the phase noise minimization circuit.

* * * * *